(12) United States Patent
Guntermann et al.

(10) Patent No.: US 12,235,010 B2
(45) Date of Patent: Feb. 25, 2025

(54) ELECTRONIC MODULE OF AN INVERTER AND METHOD FOR MOUNTING THEREOF

(71) Applicant: Hanon Systems, Daejeon (KR)

(72) Inventors: Bernd Guntermann, Lennestadt (DE); Bernadette Goebbels, Cologne (DE); Thomas Alberternst, Aachen (DE)

(73) Assignee: HANON SYSTEMS, Daejeon (KR)

(*) Notice: Subject to any disclaimer, the term of this patent is extended or adjusted under 35 U.S.C. 154(b) by 0 days.

(21) Appl. No.: 16/397,637

(22) Filed: Apr. 29, 2019

(65) Prior Publication Data

US 2019/0331360 A1 Oct. 31, 2019

(30) Foreign Application Priority Data

Apr. 30, 2018 (DE) .......................... 102018110354.9

(51) Int. Cl.
*H05K 1/18* (2006.01)
*F24F 11/89* (2018.01)
(Continued)

(52) U.S. Cl.
CPC .............. *F24F 11/89* (2018.01); *F24F 13/20* (2013.01); *H05K 1/0233* (2013.01); *H05K 1/183* (2013.01);
(Continued)

(58) Field of Classification Search
CPC ........ F24F 11/89; F24F 13/20; H05K 1/0233; H05K 1/183; H05K 3/34; H05K 7/20909
See application file for complete search history.

(56) References Cited

U.S. PATENT DOCUMENTS 9,025,334 B2 5/2015 Enami et al.
9,494,149 B2* 11/2016 Watanabe .............. H02K 11/33
(Continued)

FOREIGN PATENT DOCUMENTS

DE 112014002168 T5 1/2016
JP 2012122439 A 6/2012
(Continued)

*Primary Examiner* — Imani N Hayman
*Assistant Examiner* — Hung Q Dang
(74) *Attorney, Agent, or Firm* — NORTON ROSE FULBRIGHT US LLP

(57) ABSTRACT

Electronic module of inverter for electric compressor of climate control system having a circuit board and one or several power semiconductors and busbars, an intermediate circuit capacitor, an EMC filter coil and a support structure with outer support structure part carrying the circuit board and includes necessary securement devices to dispose the electronic module, utilizing securement elements, tightly on compressor housing along contact areas of the support structure located in a base plane. Inner support structure part framed by outer support structure part is implemented to be resilient and/or is resiliently connected with outer support structure part and carries the power semiconductors and comprises securement devices that permit securing inner support structure part, utilizing securement elements, independently of securement of outer support structure part and circuit board on compressor housing. Method for assembling the electronic module and a method for mounting the electronic module on a compressor housing is provided.

17 Claims, 14 Drawing Sheets

(51) Int. Cl.
  *F24F 13/20* (2006.01)
  *H05K 1/02* (2006.01)
  *H05K 3/34* (2006.01)
  *H05K 7/20* (2006.01)

(52) U.S. Cl.
  CPC ........... *H05K 3/34* (2013.01); *H05K 7/20909* (2013.01); *F24F 2013/202* (2013.01); *H05K 2201/10015* (2013.01); *H05K 2201/10166* (2013.01); *H05K 2201/10272* (2013.01)

(56) References Cited

U.S. PATENT DOCUMENTS

| | | | |
|---|---|---|---|
| 9,768,671 | B2 | 9/2017 | Hattori et al. |
| 10,156,239 | B2 * | 12/2018 | Nakagami ............. F04D 25/068 |
| 2003/0200761 | A1 * | 10/2003 | Funahashi ............... F04B 35/04 |
| | | | 62/228.4 |
| 2009/0122489 | A1 * | 5/2009 | Tominaga ................ H05K 3/32 |
| | | | 361/704 |
| 2016/0090987 | A1 * | 3/2016 | Yamashita ............. F04B 39/14 |
| | | | 417/410.5 |
| 2016/0111942 | A1 * | 4/2016 | Hattori ................... H02K 11/02 |
| | | | 310/72 |

FOREIGN PATENT DOCUMENTS

| | | | |
|---|---|---|---|
| JP | 2012200070 | A | 10/2012 |
| WO | 2012073423 | A1 | 6/2012 |
| WO | 2016199219 | A1 | 12/2016 |

* cited by examiner

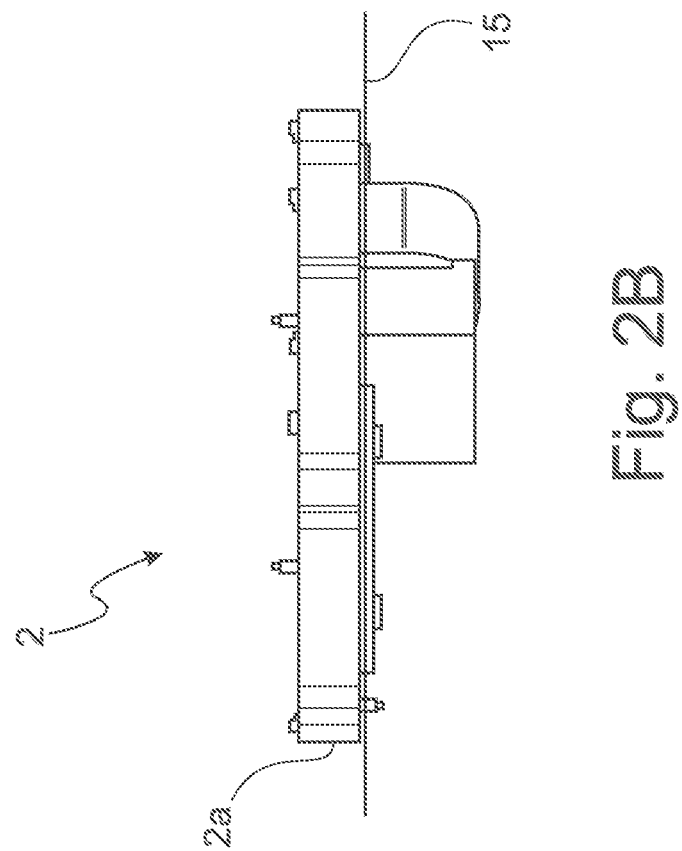
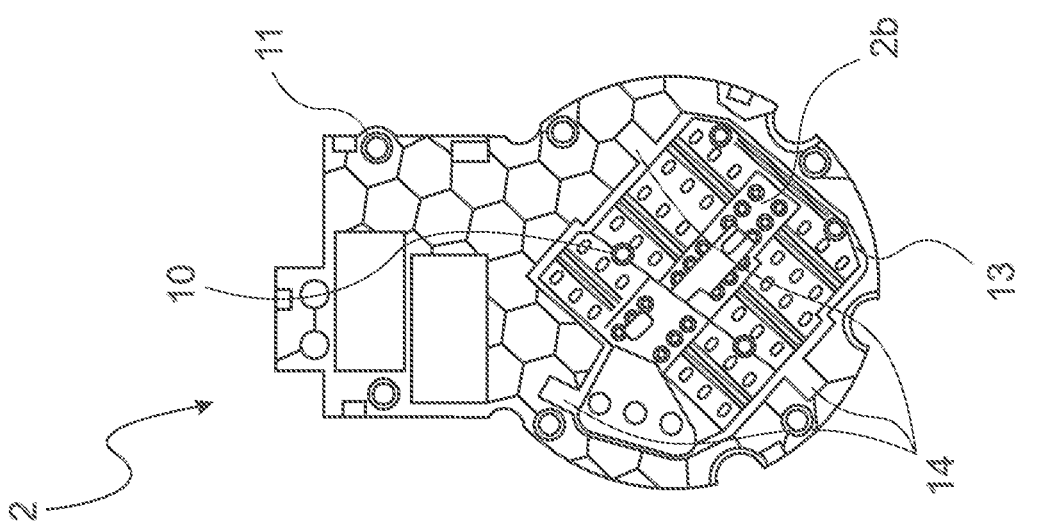

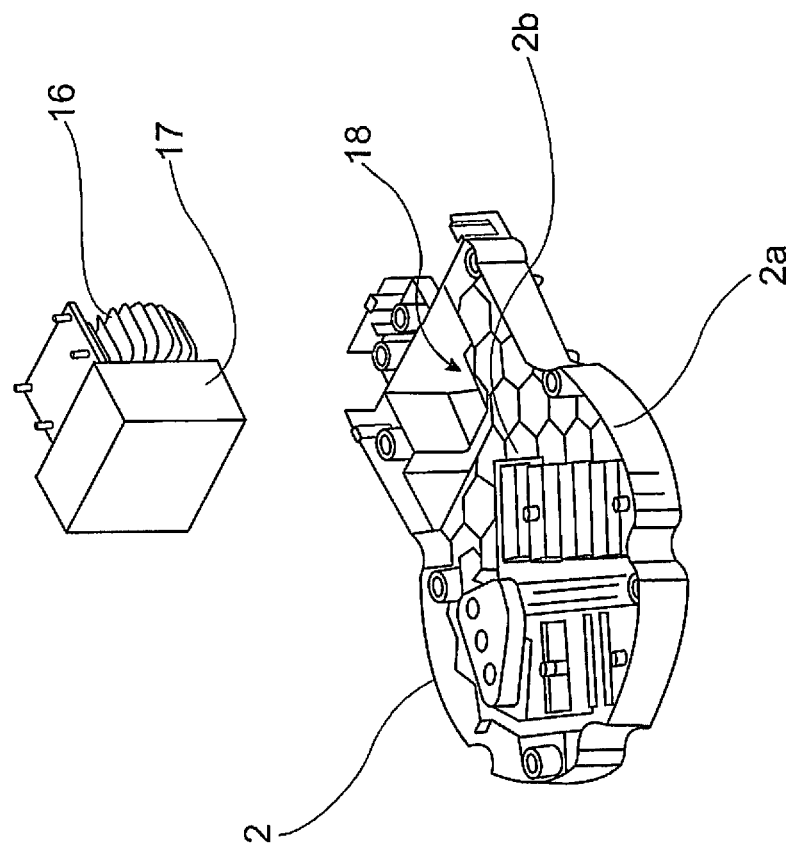

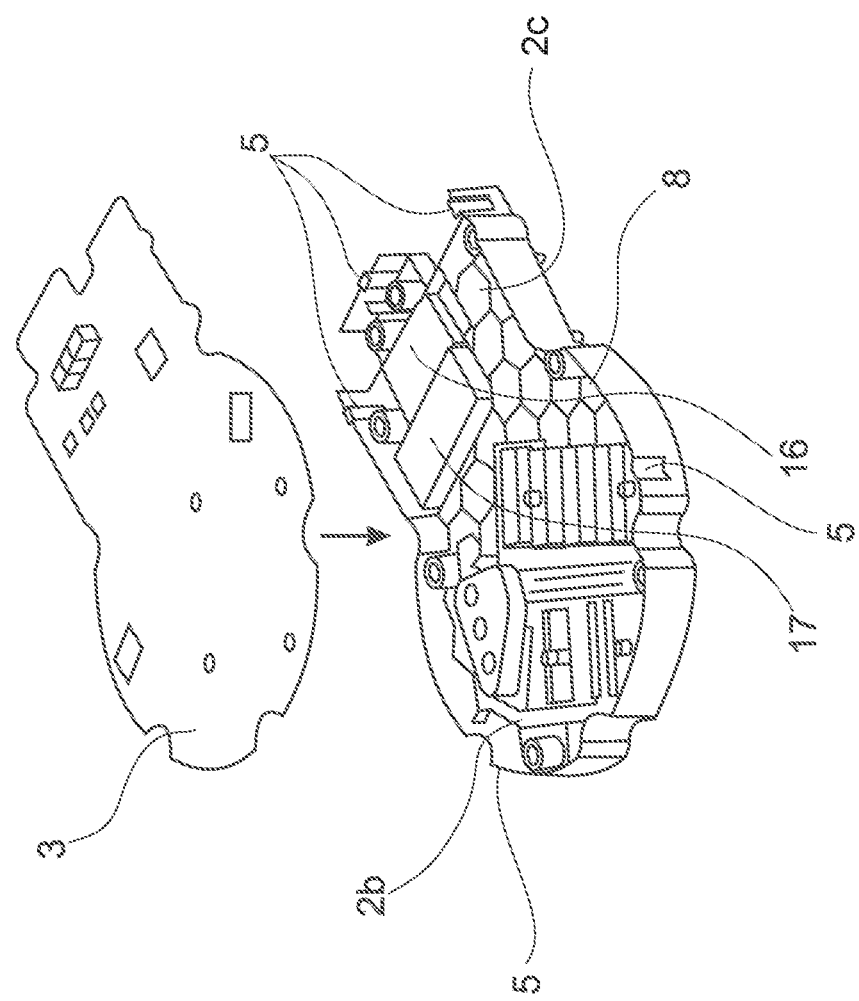

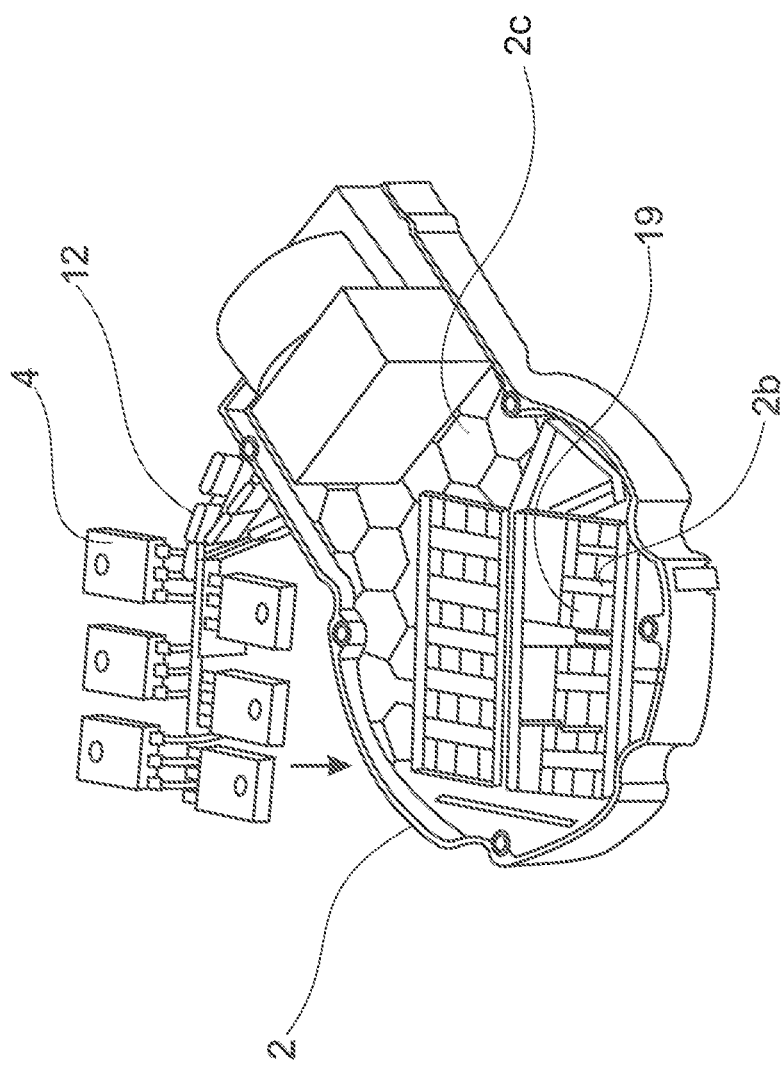

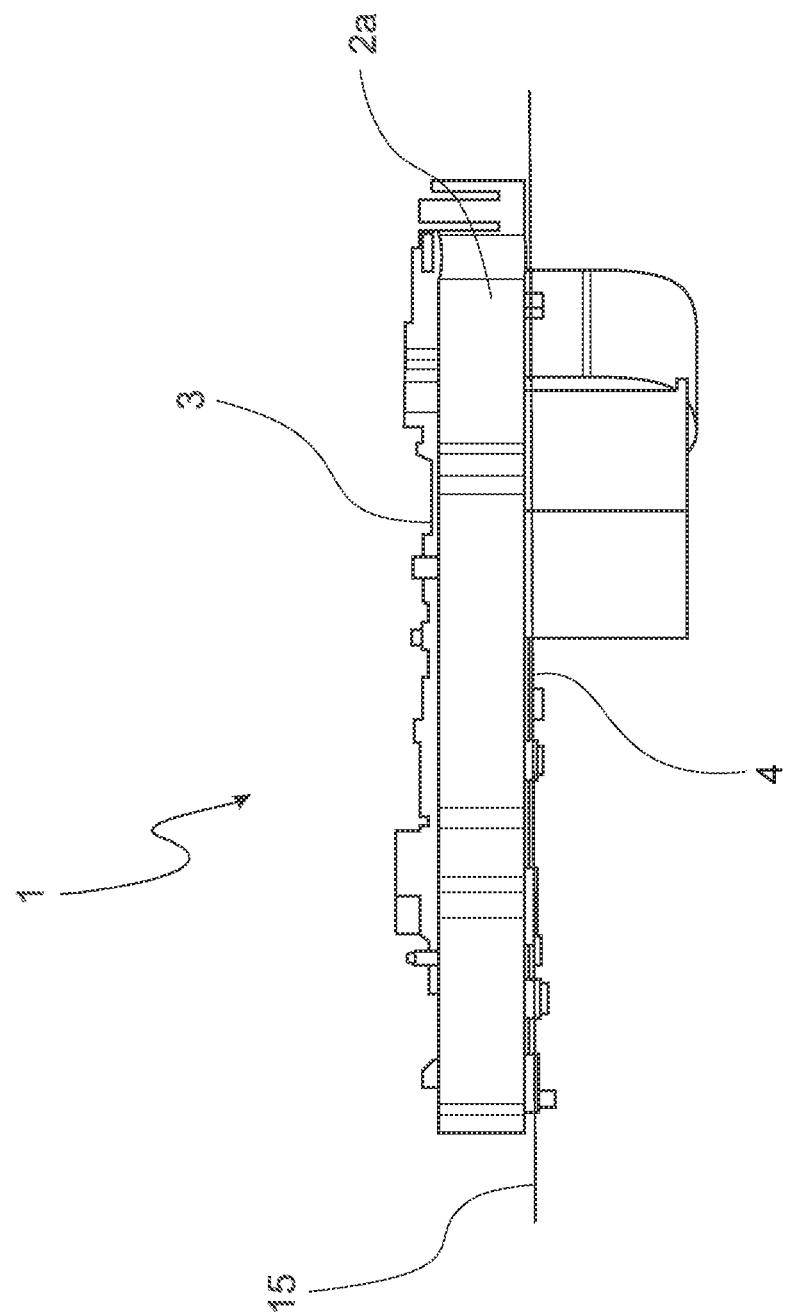

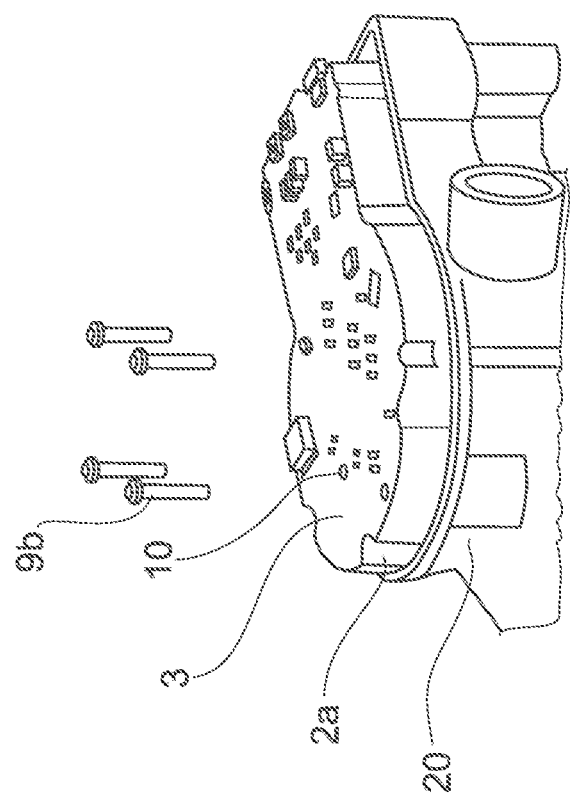
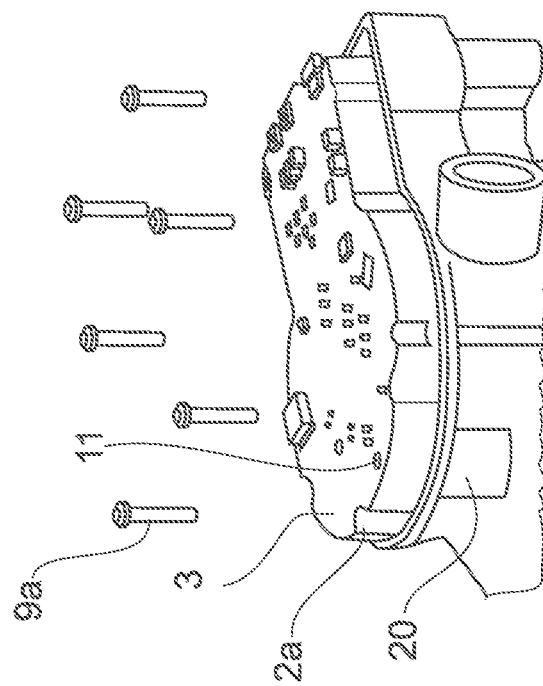

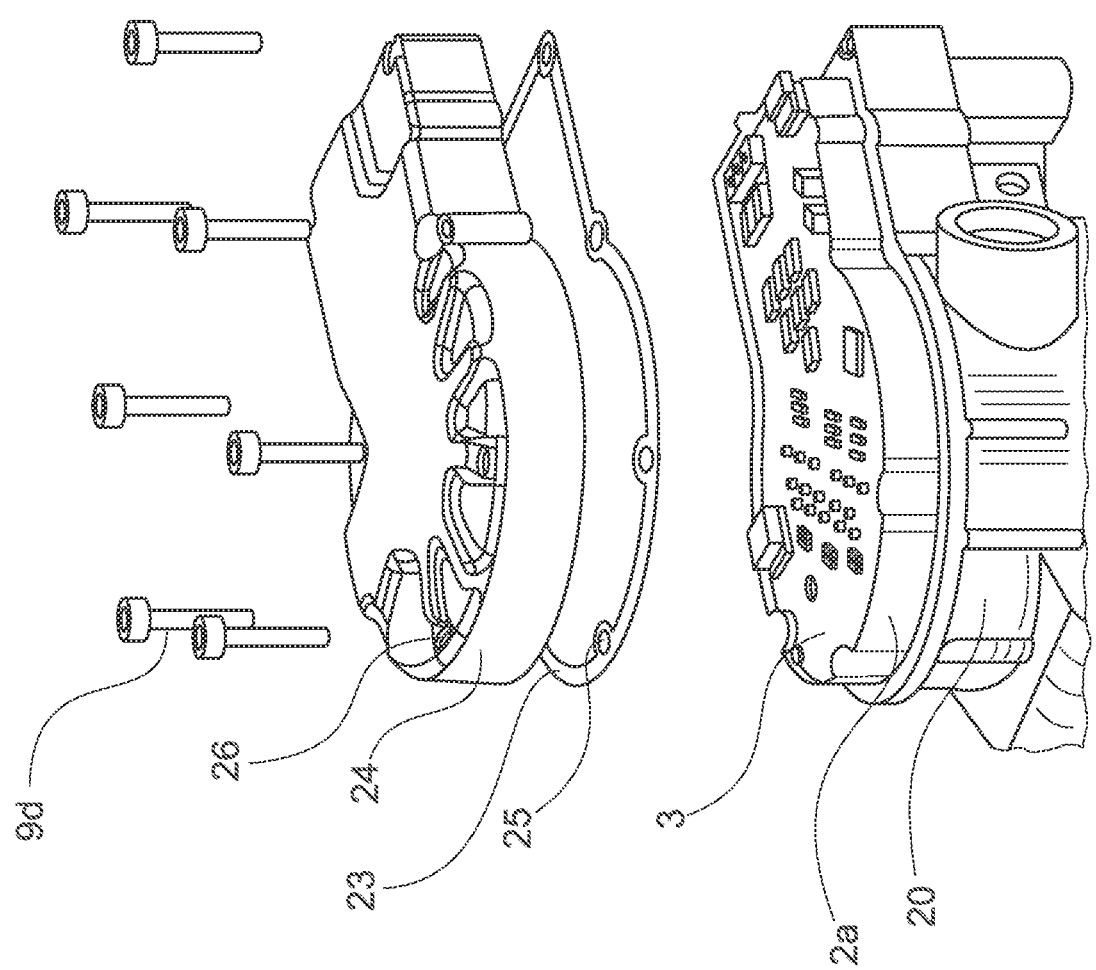

ELECTRONIC MODULE OF AN INVERTER AND METHOD FOR MOUNTING THEREOF

This application claims priority from German Patent Application No. 102018110354.9 filed on Apr. 30, 2018. The entire contents of this application is incorporated herein by reference in its entirety.

FIELD OF THE INVENTION

The invention relates to an electronic module of an inverter for an electric compressor of a climate control system. The invention, furthermore, relates to a method for assembling the electronic module as well as a method for its installation on a compressor housing.

BACKGROUND AND SUMMARY OF THE INVENTION

Modular inverters for electric compressors are known in which the power switches are mounted on a metal carrier or a substrate such as an insulated metal substrate (IMS). This carrier or this substrate are an integral constituent of the modular inverter. When mounting the modular inverter on the mechanical part of the compressor, the metal carrier or the substrate comes into close thermal contact with the metal housing of the compressor. The power switches are thus heat-dissipated across the carrier across the housing toward the cold suction gas.

Additional non-modular inverters are also known. Under these concepts the power switches are mounted directly on the compressor housing. Since for the mounting, for example by means of bolts or clamps, free access to the power switches is required, the power switches, for example metal oxide semiconductor field effect transistors (MOSFETs) or insulated gate bipolar transistors (IGBTs) are mounted first and only then is the power circuit board of the inverter emplaced and the power switches soldered to the power circuit board.

Each of the above described concepts entails disadvantages. In the case of modular inverters, in which the power switches are mounted on a metal carrier or a substrate, only indirect heat dissipation of the power switches can be realized across two thermal contact sites.

The heat flows from the power switch across the carrier or the substrate and across the compressor housing into the cold suction gas. The carrier or the substrate is an additional component. When mounting such an inverter an additional sealing is most frequently required and between substrate and compressor housing, or the carrier and the compressor housing, a second intermediate layer of a material with good thermal conductivity properties becomes necessary to improve the heat transfer. Between power switches and carrier or substrate there is already an electrically insulating, thermally well conductive intermediate layer required. The axial installation height of such an inverter is increased by the thickness of the carrier of the substrate. The concept of the non-modular inverter avoids the disadvantage of the indirect heat transfer and the necessity for two intermediate inserts of thermally conductive material. Most frequently a sealing can also be saved. However, the inverter must be assembled in the compressor fabrication, which means on the compressor line. This holds the risk of soldering errors due to lacking clean room conditions. Furthermore, contaminations on the board can lead to electrical errors. In addition, neither the mechanical compressor part nor the inverter can be tested separately in advance for their function which results in higher costs due to late detection of rejects. Repair options are also restricted since a non-modular inverter can hardly be disassembled.

The problem underlying the invention comprises in particular combining the advantages of conventional modular inverters with the advantages of conventional non-modular inverters.

The problem addressed by the invention is resolved through a modular inverter with the characteristics according to claim 1. Advantageous further developments are specified in the dependent claims.

The invention provides an electronic module of an inverter for an electric compressor of a climate control system. This module comprises a circuit board, one or several power semiconductors, busbars, at least one intermediate circuit capacitor, a filter coil for observing electromagnetic compatibility (EMC filter coil) as well as a support structure. The support structure comprises an outer support structure part which carries the circuit board and the necessary securement devices to install the electronic module, utilizing securement elements, securely on a compressor housing along contact areas of the support structure which lie in a base plane. The support structure comprises additionally an inner support structure part framed by the outer support structure part, which inner support structure part is developed to be resilient and/or is connected resiliently with the outer support structure part which carries the one or the several power semiconductors and comprises securement devices which permit the securement of the inner support structure part, utilizing securement elements, independently of the securement of the outer support structure part and the circuit board on the compressor housing. The contact areas for the securement of the inner support structure part on the compressor housing is formed at least partially by the power semiconductors, wherein the contact areas in the non-secured state project from the base plane. The contact areas, however, due to the resilient implementation of the inner support structure part and/or due to its connection with the outer support structure part are displaceable in the direction toward the normal referred to the base plane such that a spring effect is attained and the requisite contact pressure can be provided directly between the power semiconductors and the compressor housing.

The additional, inner support structure part is resiliently connected with the outer support structure part. The resilient connection advantageously permits a movement in the direction toward the normal, referred to the plane of the circuit board (PCB). The inner support structure part advantageously also comprises a multiplicity of hollow volumes for receiving the power semiconductors as well as suitable securement devices for enabling a threaded connection of the inner support structure part directly to the compressor housing. That means, either the circuit board comprises suitable openings which provide receptions for bolts of the inner support structure part, or the inner support structure part comprises projections that project through corresponding openings in the circuit board, wherein the latter variant permits screwing tightly the inner support structure part from above the circuit board onto this housing.

Since the inner support structure part is movable relative to the outer support structure part and to the circuit board, it is possible to bring the inner support structure part nearly into the same position as the position during the final assembly. Soldering the connector pins of the power semiconductors can subsequently take place precisely in this position which can be assured through a suitable installation aid (assembly jig).

After the final assembly of the module inverter on the compressor housing, the bolts of the outer support structure part as well as the bolts of the inner support structure part can be tightened. Since the soldering takes place under the same conditions in the assembly jig, no stress is generated at the solder joints.

To generate uniform contact pressure on all power semiconductors, the inner support structure part is advantageously implemented such that it has relatively low rigidity such that the inner support structure part acts as a spring. The inner support structure part can therefore compensate the thickness tolerances of the power semiconductor housing. The inner support structure part is preferably fabricated of a synthetic material.

Compared to previously known inverter arrangements, the invention offers a markedly improved heat dissipation of the power semiconductors.

In addition, the inverter assembly is feasible under clean room conditions, apart from the compressor line. The inverter module can be tested for its function in advance and by itself. The axial installation height of the inverter assembly can be considerably reduced in comparison to prior art.

In comparison to the conventional modular concept, the invention also leads to savings with respect to complexity and parts number.

According to a preferred embodiment of the invention, the at least one intermediate circuit capacitor and the EMC filter coil are installed in the outer support structure part. The plane of the circuit board is preferably oriented parallel to the base plane. The components, which means the one or the several power semiconductors, the busbars, the at least one intermediate circuit capacitor and the EMC filter coil are selectively soldered to the circuit board.

According to a preferred embodiment of the invention, the securement devices of the outer support structure part that are necessary to dispose the electronic module, utilizing securement elements, fixedly on a compressor housing are preferably metal sleeves. The circuit board advantageously rests on the metal sleeves of the outer support structure part. The outer support structure part can moreover comprise elements for developing a latch or clamp connection with the edge of the circuit board. securement devices of the inner support structure part, which permit the securement of the inner support structure part, utilizing securement elements, independently of the securement of the outer support structure part and the circuit board on the compressor housing, are preferably metal sleeves that penetrate through the circuit board.

Between the inner support structure part and the power semiconductors there is preferably line contact.

A further aspect of the invention comprises a method for mounting the above described electronic module comprising the following method steps:
a) emplacing or adhering an EMC filter coil and at least one intermediate circuit capacitor into a reception on the outer support structure part developed for this purpose,
b) a provisional securement of the circuit board on the outer support structure part utilizing latch or clamp connections,
c) emplacing power semiconductors and busbars into receptions within the inner support structure part provided for this purpose,
d) selective soldering of the power semiconductor, the busbars, the EMC filter coil as well as the at least one intermediate circuit capacitor to the circuit board.

According to an especially advantageous embodiment of the invention, the selective soldering is carried out while the outer support structure part and the inner support structure part are pressed against the base plane.

The invention relates furthermore to a method for disposing the above described electronic module on a compressor housing comprising the method steps:
a) mounting electric connections to the compressor housing,
b) pressing the assembled electronic module onto the compressor housing,
c) inserting securement elements into openings in the circuit board and into openings congruent thereto of the securement devices of the outer support structure part and securing the electronic module by means of securement elements on the compressor housing,
d) inserting securement elements through openings of the securement devices of the inner support structure part and securing the inner support structure part and securement of the inner support structure part by means of these securement elements on the compressor housing.

The method can further comprise a step of applying a sealing and a cover over the electronic module.

Further details, characteristics and advantages of embodiments of the invention will become evident based on the following description of embodiment examples with reference to the associated drawing.

BRIEF DESCRIPTION OF THE FIGURES

FIG. 2A: a detailed view of the support structure with an outer support structure part and an inner support structure part, top view FIG. 2B: a lateral view of the outer support structure part and of the inner support structure part along a longitudinal side, FIG. 4A: a schematic representation of a first step of a method for assembling the electronic module, FIG. 4B: a schematic representation of a second step of the method for assembling the electronic module, FIG. 4C: a schematic representation of a third step of the method for assembling the electronic module, FIG. 4E: a schematic representation of a fourth step of the method for assembling the electronic module, the selective soldering, FIG. 5C: a schematic representation of a third step of the mounting of the electronic module on the compressor housing, FIG. 5D: a schematic representation of a fourth step of the mounting of the electronic module on the compressor housing, FIG. 5F: a schematic representation of a sixth step of mounting the electronic module on the compressor housing.

DETAILED DESCRIPTION

Figure 1C:
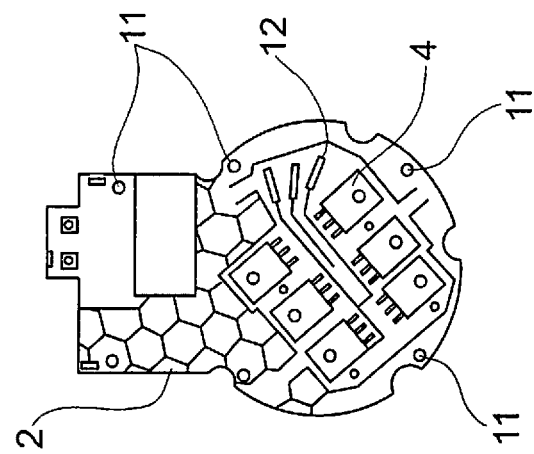
FIG. 1C: A view onto the support structure from below and onto a group of power semiconductors.
Figure 1B:
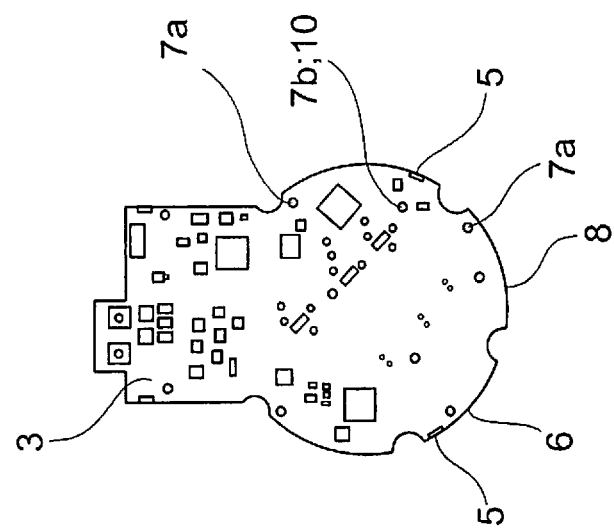
FIG. 1B: a top view onto the circuit board.
Figure 1A:
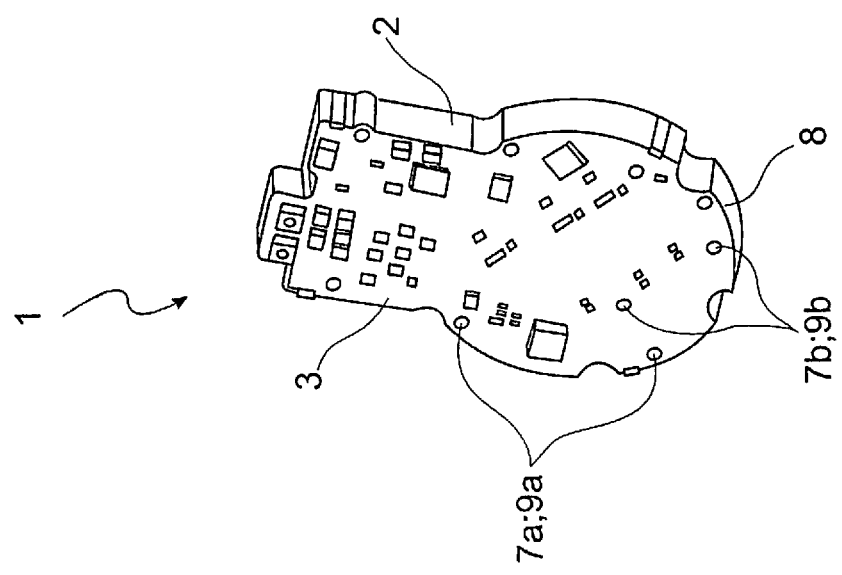
FIG. 1A: a schematic representation of an electronic module with circuit board and support structure in a perspective view from above.

FIG. 1A, FIG. 1B and FIG. 1C show schematically the basic structure of an electronic module 1 of an inverter for an electric compressor, which comprises a support structure 2, a circuit board 3 (PCB), power semiconductors 4, such as bipolar transistors with insulated gate (IGBTs), as well as an EMC filter coil and intermediate circuit capacitors (not visible in FIGS. 1A to 1C). Such an electronic module optionally comprises also a heat conducting pad (gap pad). All components are soldered selectively. The circuit board 3 is provisionally secured on the support structure 2 across a multiplicity of clasps 5 as securement means which enter into a latching or clamping connection with the edge 6 of the circuit board 3.

FIG. 1A shows the electronic module 1 with circuit board 3 and support structure 2 in a perspective view from above, which means with view onto the circuit board 3. The circuit board 3 comprises several openings 7a, 7b, wherein both groups of openings 7a, 7b differ from one another in principle with regard to their position on the circuit board 3. The first group comprises a total of six openings 7a which, in comparison to a second group of a total of four openings 7b, is placed closer to the edge 6 of the circuit board 3 and closer to an outer edge 8 of the support structure 2.

As FIGS. 1A and 1B show, the openings 7a of the first group have, in addition, a significantly smaller diameter than the openings 7b of the second group. The reason for this is that the openings 7a of the first group are intended for the insertion of securement elements 9a in the form of bolts wherein these openings 7a cannot be greater than the bolt head that serves as abutment and/or press-on area against the perforated circuit board 3. In contrast, through the second group of openings 7b project sleeves 10 which are provided as securement devices, namely for guiding and staying securement elements. According to FIG. 1A, the securement elements are bolts 9b, whose bolt head is smaller than the openings 7b and is pressed, not onto the circuit board 3 but against the particular upper front face of sleeve 10.

FIG. 1C shows a view onto the support structure 2 from below, wherein the installed power semiconductors 4 are visible. Congruent with the first group of openings 7a, six further sleeves 11 are disposed which also represent securement devices provided for guiding bolts and simultaneously for staying the circuit board. The four sleeves 10 placed further inward are positioned in the region of the support structure 2 in which the power semiconductors 4 and busbars 12 are installed.

FIG. 2A shows the structure of the support structure 2 for the electronic module, wherein the support structure 2 is developed as a synthetic carrier. The support structure 2 comprises a first outer support structure part 2a and a second inner support structure part 2b framed by the outer support structure part 2a. The outer support structure part 2a and the inner support structure part 2b are separated one from the other by a slot 13 bordering the inner support structure part 2b. The connection of the inner support structure part 2b with the outer support structure part 2a takes place at several sites through resilient elements in the form of lugs 14. In the depicted implementation the lugs 14 are substantially rectangular and each is secured on opposite sides of the rectangle on the inner support structure part 2b, and, on the one hand, and, on the other hand, on the outer support structure part 2a. The outer support structure part 2a functions as a carrier for the circuit board 3, the EMC filter coil and the intermediate circuit capacitor. The inner support structure part 2b is provided as a carrier for the IGBTs and busbars.

The outer support structure part 2a, as already stated, comprises a multiplicity of metal sleeves 11 through which the securement elements, preferably bolts, can be fed for securing the outer support structure part 2a and the circuit board 3 on the compressor housing.

The inner support structure part 2b comprises, as already stated, also metal sleeves 10 which, in contrast to the sleeves 11 of the outer support structure part 2a, are provided for penetrating the circuit board 3 and can be inserted via the securement elements, for example bolts, for the securement of the inner support structure part 2b on the compressor housing. Thereby that the metal sleeves 10 of the inner support structure part 2b penetrate through the circuit board, the inner support structure part 2b can be secured or bolted onto the compressor housing independently of the circuit board and also be secured independently of the outer support structure part 2a. Through the clasps 5, see also FIG. 1A, the circuit board 3 can be provisionally secured during the selective soldering and until the final assembly of the electronic module on the compressor housing.

In the initial state of the support structure 2, which means before the mounting on a housing, the inner support structure part 2b projects from the outer support structure part 2a, as is shown in FIG. 2B. Stated more precisely, the inner support structure part 2b projects from a base plane 15 of the support structure 2, wherein the base plane 15 corresponds to a plane along which the support structure 2 is disposed on a compressor housing. The position of the inner support structure part 2b, connected with the resilient disposition of the inner support structure part 2b on the outer support structure part 2a, results in a lesser force being required which must be expended in the direction of the normal referred to the base plane 15 in order to mount the support structure part 2b on the compressor housing. As an additional support structure part and, due to its position projecting from the base plane 15 and the outer support structure part 2a, on the one hand, and its resilient disposition on the outer support structure part 2a, on the other hand, the inner support structure part 2b provides consequently the contact pressure which is required directly between the power semiconductors, disposed within the inner support structure part 2b, and the compressor housing.

Figure 3A:
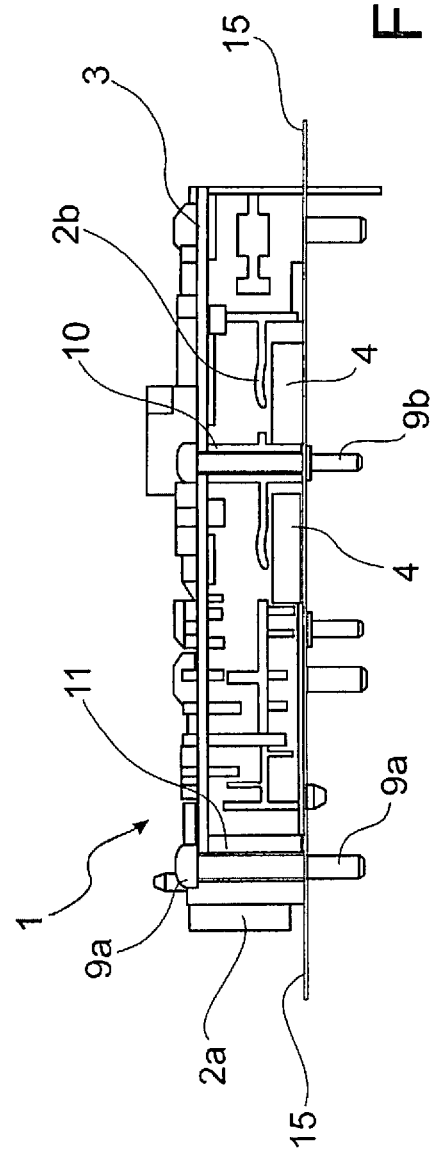
FIG. 3A: a sectional representation of the electronic module with circuit board, bipolar transistors with insulated gate and securement means along the longitudinal side of the outer support structure part.

FIG. 3A shows the electronic module 1 secured on a compressor housing which is only shown schematically in the form of the base plane 15. Bolts 9a as securement elements of the outer support structure part 2a connect lastly the outer support structure part 2a and the circuit board 3 with the compressor housing. Bolts 9a are herein fed through metal sleeves 11 of the outer support structure part 2a, on the upper front face of which, as shown in conjunction with the sectional representation of a metal sleeve 11, rests the circuit board 3. The metal sleeves 11 are with their opposite front face on the base plane 15.

The metal sleeves 10 of the inner support structure part 2b penetrate through the circuit board 3 such that the inner support structure part 2b can be bolted onto the compressor housing independently of the outer support structure part 2a.

Figure 3B:
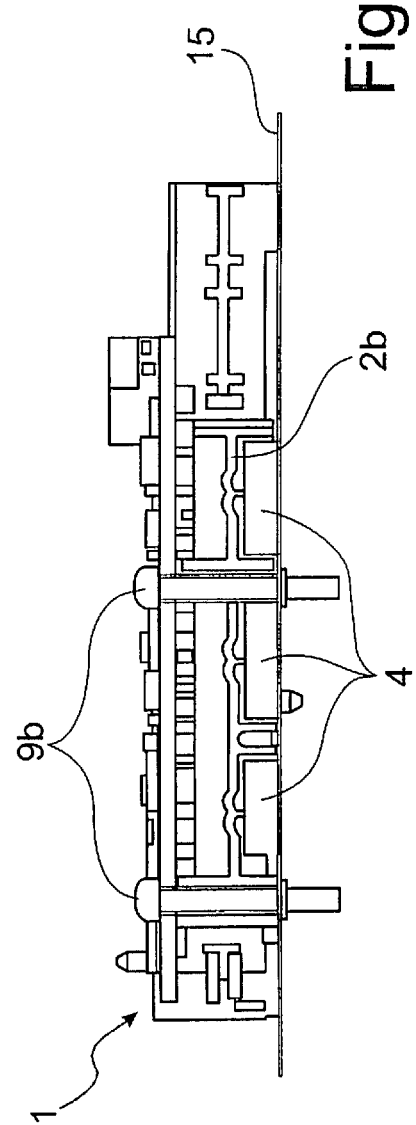
FIG. 3B: a sectional representation of the electronic module with circuit board, bipolar transistors with insulated gate and securement means in the region of the inner support structure part.

FIG. 3B shows a sectional representation of the electronic module 1 in the region of the inner support structure part 2b with circuit board 3, power semiconductors 4 in the form of bipolar transistors with insulated gate (IGBTs), with securement elements in the form of bolts 9b as well as securement devices in the form of metal sleeves 10 for guiding and staying these securement elements. In the sectional representation can be seen that the metal sleeves 10 as guide and stay elements of the inner support structure part 2b project through the circuit board 3.

The bolts 9b of the inner support structure part 2b that are fed through the metal sleeves 10, alone generate the contact force between the power semiconductors 4, which means the IGBTs, and the metal compressor housing depicted by the base plane 15. There is herein line contact between the inner support structure part 2b and the power semiconductors 4, the IGBTs, wherein the inner support structure part 2b, comprised of synthetic material, acts as a synthetic spring.

FIG. 4A to FIG. 4E illustrate schematically the sequence of assembling the electronic module 1 before it is subsequently mounted on a compressor housing.

FIG. 4A shows a first step, the inserting or adhering of an EMC filter coil 16 and an intermediate circuit capacitor 17 into a reception 18 developed for this purpose on an upper side of the outer support structure part 2a.

FIG. 4B shows the second step of the method of the assembly, namely a provisional securement of the circuit board 3 in the outer support structure part 2a by snapping into the clasps 5 that are disposed on the upper edge 8 of the outer support structure part 2a.

In a third step of the method of assembly which is shown in FIG. 4C, power semiconductors 4, for example IGBTs, and busbars 12 are set into pocket-like receptions 19 provided for this purpose within an inner support structure part 2b, wherein the pocket-like receptions 19, referred to the upper side 2c of the outer support structure part 2a, are located on the backside.

Figure 4D:
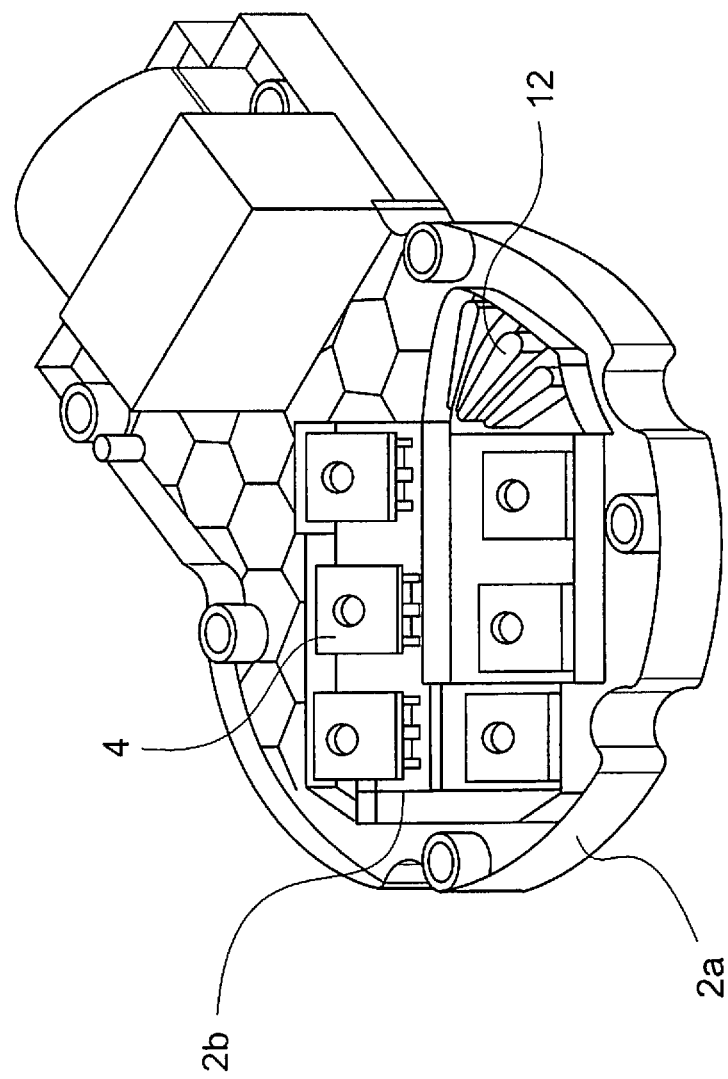
FIG. 4D: a schematic representation of the assembled electronic module after the third method step.

FIG. 4D shows a schematic representation of the assembled electronic module after the third method step. To be noted is that the inner support structure part 2b with the power semiconductors 4, in this case the IGBTs, and the busbars 12 projects from the base plane of the outer support structure part 2a.

In the fourth step the power semiconductors 4, busbars, the EMC filter coil as well as the intermediate circuit capacitor are soldered selectively to the circuit board 3. The selective soldering is carried out while the outer support structure part 2a and the inner support structure part 2b are pressed against the base plane 15. Such an approach ensures that no stress is generated at the solder points when the electronic module 1 is mounted to a compressor housing, for example of a compressor. The soldered electronic module 1 is shown schematically in FIG. 4E.

FIG. 5A to FIG. 5G show schematically a method for mounting the above described electronic module on a compressor housing 20.

Figure 5A:
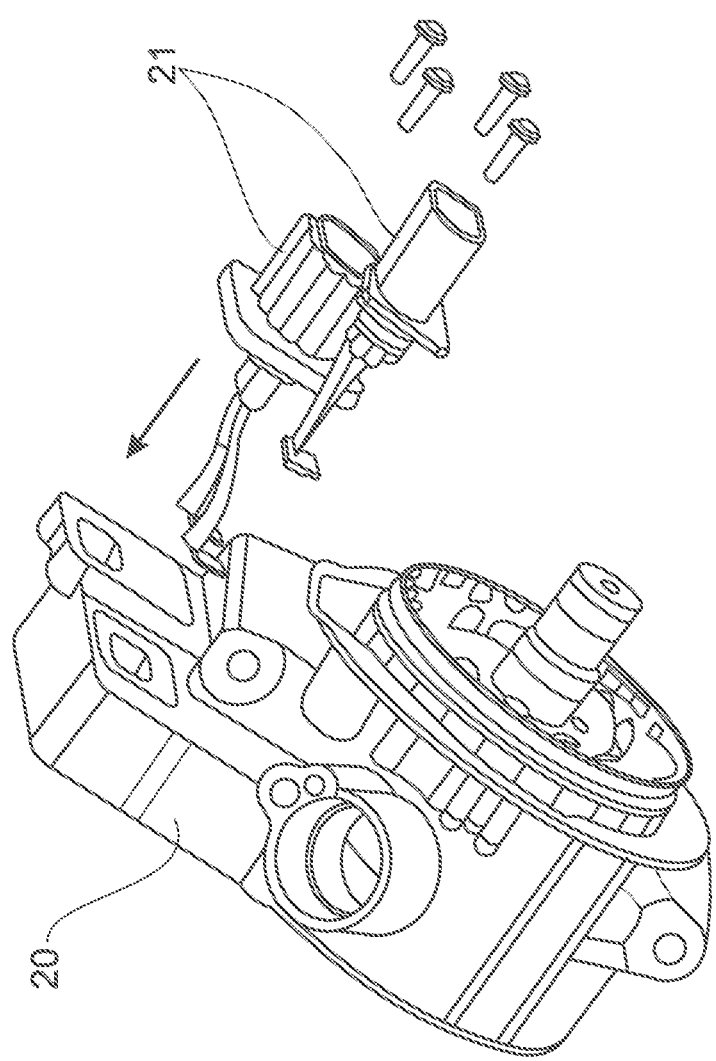
FIG. 5A: a schematic representation of a first step of mounting the electronic module on a compressor housing.

In FIG. 5A is shown the first step, the mounting of electric connections 21 to the compressor housing 20.

Figure 5B:
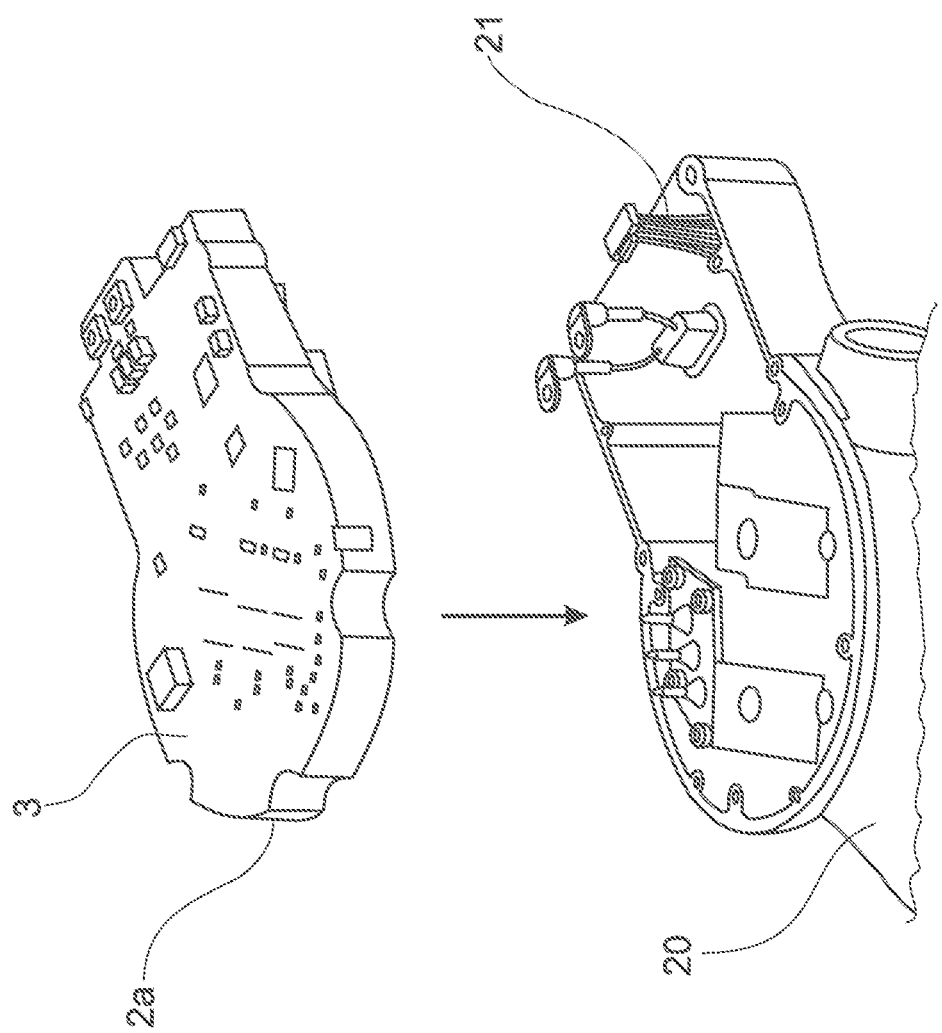
FIG. 5B: a schematic representation of a second step of mounting the electronic module on the compressor housing.

In the second step, see FIG. 5B, the assembled electronic module 1 is pressed onto the compressor housing 20.

In a third step, shown in FIG. 5C, the securement elements, in the example shown overall six bolts 9a, are inserted from above into openings in the circuit board 3, that are congruent with the openings of said metal sleeves 11 of the outer support structure part 2a on which the circuit board 3 rests, whereby a passage through the circuit board 3 and the outer support structure part 2a to the compressor housing 20 is provided, and the electronic module 1 is secured on the compressor housing 20 by means of the bolts 9a.

Subsequently in a further, fourth, step shown in FIG. 5D, securement elements in the form of four bolts 9b, are inserted from above through openings of the inner support structure part 2b, preferably openings of said sleeves 10 penetrating the circuit board 3, which also provide a passage to the compressor housing 20, into the compressor housing 20 and tightened whereby the inner support structure part 2b of the electronic module 1 is secured or bolted by means of these securement elements on the metal compressor housing 20.

Figure 5E:
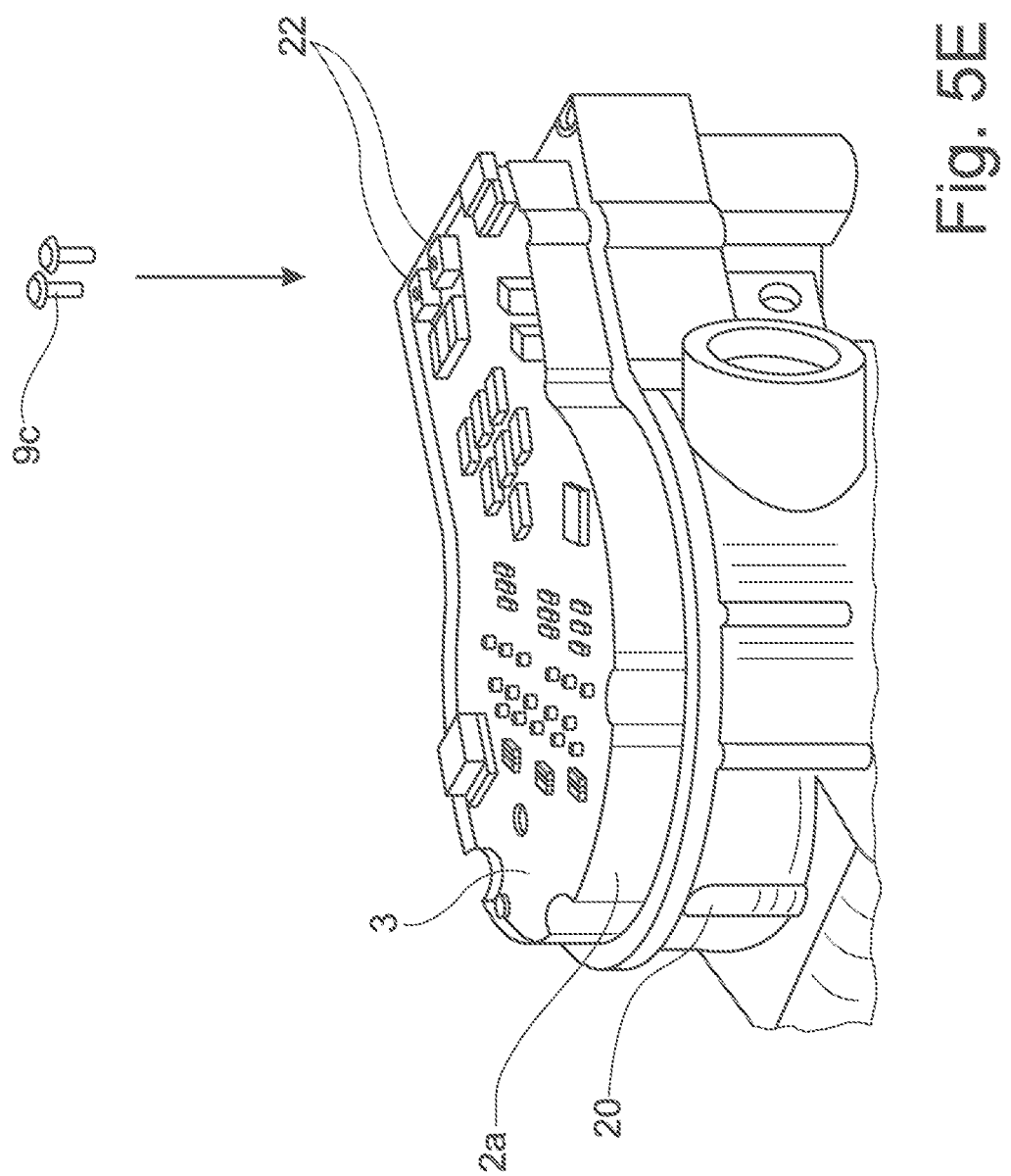
FIG. 5E: a schematic representation of a fifth step of mounting the electronic module on the compressor housing.

Subsequently, in a fifth step, shown in FIG. 5E, the securement of high-voltage bus lines takes place by means of cable terminals 22 and two bolts 9c on the circuit board 3. The logic part of the circuit board 3 can be connected with a logic connector plug across a click connection.

The sixth step shown in FIG. 5F comprises applying a sealing 23 for a cover 24 of the electric module 1, placing the cover 24 as well as the securing of the cover 24.

The sealing 23, which substantially corresponds to the form of a lower rim of the cover 24, is placed onto the metal housing such that the sealing 23 borders the already secured outer support structure part 2a of the electronic module 1. The sealing 23 fabricated of a resilient material, comprises several eyes 25, distributed over the entire sealing 23, of the resilient material of sealing 23, through which a securement element, in the depicted example a bolt 9d, can be inserted into the metal compressor housing 20. The cover 24 is also placed onto the metal compressor housing 20, stated more precisely placed with its lower edge onto the sealing 23, wherein the cover 24 comprises several throughbores 26 which are brought into congruent position with the eyes 25 of sealing 23. Through the bores 26 and the congruent eyes 25 the bolts 9d are inserted into the metal compressor housing 20 as securement elements and tightened.

Figure 5G:
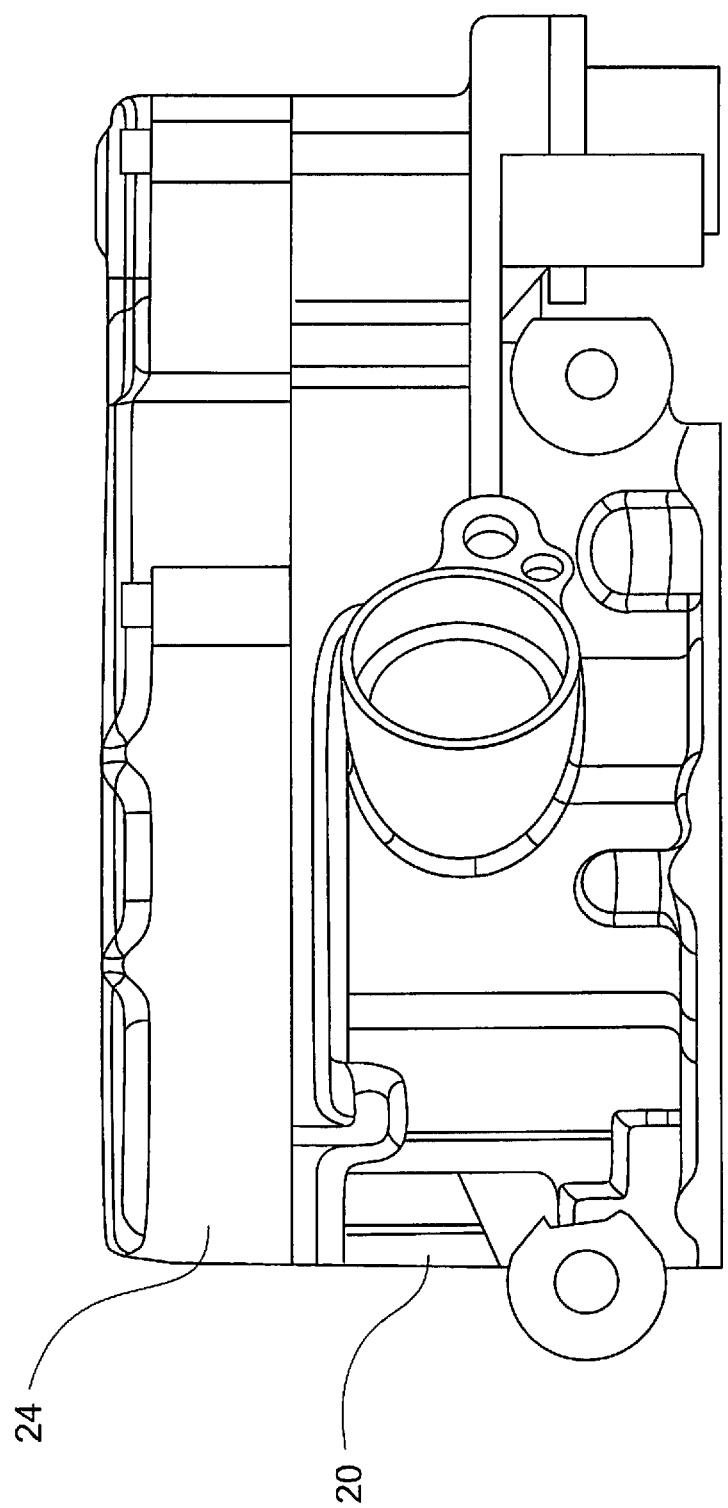
FIG. 5G: a schematic representation of the electronic module mounted on the compressor housing.

FIG. 5G lastly shows the completed assembly of the metal compressor housing 20 and the electronic module 1 secured thereon, covered with the cover 24 and sealed with sealing 23.

LIST OF REFERENCE NUMBERS

1 Electronic module, inverter module
2 Support structure
2a First, outer support structure part
2b Second, inner support structure part
3 Circuit board
4 Power semiconductor
5 Clasp
6 Edge of circuit board
7a Openings in the circuit board
7b Openings in the circuit board
8 Outer edge of support structure
9a Securement elements for securing the outer support structure part, bolts
9b Securement elements for securing the inner support structure part
9c Securement elements for connecting the high-voltage bus by means of cable terminals
9d Securement elements for securing the cover, bolts
10 Metal sleeve of inner support structure part
11 Metal sleeve of outer support structure part 12 Busbars
13 Slot
14 Lug
15 Base plane
16 EMC filter coil
17 Intermediate circuit capacitor
18 Reception for EMC filter coil and intermediate circuit capacitor
19 Pocket-like reception in inner support structure part
20 Compressor housing
21 Electrical connections
22 Cable terminals
23 Sealing
24 Cover
25 Eyes
26 Bore in the cover

What is claimed:

1. An electronic module of an inverter for an electric compressor of a climate control system, comprising a circuit board and one or several power semiconductors and busbars, at least one intermediate circuit capacitor, an EMC filter coil, and a support structure comprising an outer support structure part that carries the circuit board and comprises securement devices to dispose the electronic module, utilizing securement elements, securely on a compressor housing along contact areas of the support structure located in a base plane, and an inner support structure part, framed by the outer support structure part, which is resiliently connected with the outer support structure part through a resilient lug, carries the one or the several power semiconductors and comprises the securement devices that permit securing the inner support structure part, utilizing securement elements, independently of the securement of the outer support structure part and the circuit board, on the compressor housing, wherein the contact areas for the securement of the inner support structure part on the compressor housing are at least partially formed by the power semiconductors, and wherein the inner support structure part in a non-secured state projects from the base plane, yet is displaceable through the resilient lug of the inner support structure part with the outer support structure part in a direction perpendicular to the base plane, such that the power semiconductors is pressed toward the compressor housing by a spring effect of the inner support structure part when the electric module is installed on the compressor housing, thereby a requisite contact pressure between the power semiconductors and the compressor housing is provided.

2. An electronic module according to claim 1, wherein the at least one intermediate circuit capacitor and the EMC filter coil are installed in the outer support structure part.

3. An electronic module according to claim 1, wherein the power semiconductors, the busbars, the EMC filter coil as well as the at least one intermediate circuit capacitor are connected to the circuit board with solder.

4. An electronic module according to claim 1, wherein the securement devices of the outer support structure part necessary for securing the electronic module, utilizing securement elements tightly on the compressor housing, are metal sleeves.

5. An electronic module according to claim 4, wherein the circuit board rests on the metal sleeves of the outer support structure part.

6. An electronic module according to claim 1, wherein the outer support structure part comprises elements for developing a latch or clamp connection with the edge of the circuit board.

7. An electronic module according to claim 1, wherein the securement devices of the inner support structure part that permit, utilizing securement elements, independently of the securement of the outer support structure part and the circuit board on the compressor housing, are metal sleeves projecting through the circuit board.

8. An electronic module according to claim 1, wherein there is line contact between the inner support structure part and the power semiconductors.

9. An electronic module of an inverter for an electric compressor of a climate control system comprising:
   a circuit board;
   a support structure comprising an outer support structure part and an inner support structure part, wherein the circuit board is coupled on an upper edge of the outer support structure part;
   one or more power semiconductors and busbars which are disposed on the inner support structure part; and
   at least one intermediate circuit capacitor and an EMC filter coil which are disposed on the outer support structure part;
   wherein the inner support structure part is resiliently connected with the outer support structure part via a resilient lug to generate uniform contact pressure on all power semiconductors.

10. An electronic module according to claim 9, wherein the power semiconductors, the busbars, the EMC filter coil as well as the at least one intermediate circuit capacitor are selectively soldered to the circuit board.

11. An electronic module according to claim 9, wherein the inner support structure part,
   wherein the inner support structure part in a non-secured state projects from a base plane, yet is displaceable through the resilient lug of the inner support structure part with the outer support structure part in a direction perpendicular to the base plane, such that the power semiconductors is pressed toward the compressor housing by a spring effect of the inner support structure part when the electric module is installed on the compressor housing, thereby a requisite contact pressure between the power semiconductors and the compressor housing is provided.

12. An electronic module according to claim 9, wherein the securement devices of the outer support structure part necessary for securing the electronic module, utilizing securement elements tightly on a compressor housing, are metal sleeves.

13. An electronic module according to claim 12, wherein the circuit board rests on the metal sleeves of the outer support structure part.

14. An electronic module according to claim 9, wherein the outer support structure part comprises elements for developing a latch or clamp connection with the edge of the circuit board.

15. An electronic module according to claim 9, wherein securement devices of the inner support structure part that permit, utilizing securement elements, independently of the securement of the outer support structure part and the circuit board on the compressor housing, are metal sleeves projecting through the circuit board.

16. An electronic module according to claim 9, wherein there is line contact between the inner support structure part and the power semiconductors.

17. An electronic module of an inverter for an electric compressor of a climate control system, comprising a circuit board and one or several power semiconductors and busbars, at least one intermediate circuit capacitor, an EMC filter coil, and a support structure comprising an outer support structure part that carries the circuit board and comprises securement devices to dispose the electronic module, utilizing securement elements, securely on a compressor housing along contact areas of the support structure located in a base plane, and an inner support structure part, framed by the outer support structure part, which is resiliently connected with the outer support structure part, carries the one or the several power semiconductors and comprises the securement devices that permit securing the inner support structure part, utilizing securement elements, independently of the securement of the outer support structure part and the circuit board, on the compressor housing, wherein the contact areas for the securement of the inner support structure part on the compressor housing are at least partially formed by the power semiconductors, and wherein the inner support structure part in a non-secured state projects from the base plane, yet is displaceable through a resilient lug of the inner support structure part with the outer support structure part in a direction perpendicular to the base plane, such that a spring effect is attained and a requisite contact pressure between the power semiconductors and the compressor housing is provided.

\* \* \* \* \*